United States Patent
Yamaguchi et al.

(10) Patent No.: US 7,486,921 B2
(45) Date of Patent: *Feb. 3, 2009

(54) METHOD OF PRODUCING ELECTRONIC CIRCUIT, AND ELECTRONIC CIRCUIT SUBSTRATE

(75) Inventors: Naoko Yamaguchi, Yokohama (JP); Hideo Aoki, Yokohama (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 11/017,922

(22) Filed: Dec. 22, 2004

(65) Prior Publication Data

US 2005/0153220 A1 Jul. 14, 2005

(30) Foreign Application Priority Data

Dec. 26, 2003 (JP) ............................. P2003-435756

(51) Int. Cl.
*G03G 15/20* (2006.01)
(52) U.S. Cl. .................................. 399/320; 430/124.1
(58) Field of Classification Search ................. 399/320; 430/124.1
See application file for complete search history.

(56) References Cited

U.S. PATENT DOCUMENTS

| | | | |
|---|---|---|---|
| 4,696,861 | A | 9/1987 | Tatematsu et al. |
| 4,698,907 | A * | 10/1987 | Soszek ........................ 29/846 |
| 4,897,326 | A | 1/1990 | Marengo |
| 6,214,508 | B1 | 4/2001 | Kamada et al. |
| 6,403,272 | B1 * | 6/2002 | Kamada et al. .......... 430/108.6 |
| 6,440,625 | B1 | 8/2002 | Berlin |
| 6,563,225 | B2 | 5/2003 | Soga et al. |
| 6,977,130 | B2 * | 12/2005 | Aoki et al. ............... 430/120.2 |

(Continued)

FOREIGN PATENT DOCUMENTS

JP 63-180952 7/1988

(Continued)

OTHER PUBLICATIONS

Yamaguchi, N. et al., "New Process of Manufacturing Printed Circuit Boards Using Electrophotography Technology", 2004 ICEP Proceedings, pp. 168-172, (Apr. 2004).

(Continued)

*Primary Examiner*—Hoa V Le
(74) *Attorney, Agent, or Firm*—Finnegan, Henderson, Farabow, Garrett & Dunner, L.L.P.

(57) ABSTRACT

According to one mode of the present invention, a method of producing an electronic circuit, comprising forming an integrated resin layer having a prescribed thickness by repeating a resin layer forming process a number of times so that resin layers are layered to be integrated with all the resin layers on a substrate, wherein the resin forming process comprises charging the surface of a photoconductor; forming an electrostatic latent image having a prescribed pattern on the surface of the charged photoconductor; forming a visible image by electrostatically attaching charged particles composed of resin on the surface of the photoconductor on which the electrostatic latent image is formed; transferring the visible image formed on the surface of the photoconductor and composed of the charged particles onto the substrate; and fixing said visible image transferred onto said substrate on said substrate to form the resin layer on said substrate, is provided.

9 Claims, 5 Drawing Sheets

U.S. PATENT DOCUMENTS

2004/0197487 A1* 10/2004 Aoki et al. .................. 427/458

FOREIGN PATENT DOCUMENTS

| JP | 7-86721 | 3/1995 |
| JP | 07-263841 | 10/1995 |
| JP | 08-056077 | 2/1996 |
| JP | 8-88456 | 4/1996 |
| JP | 11-312859 | 11/1999 |
| JP | 11-354908 | 12/1999 |
| JP | 2001-284769 | 10/2001 |
| WO | WO 03/009655 A1 | 1/2003 |

OTHER PUBLICATIONS

Aoki, H. et al., "Wiring Board and Multilayer Wiring Board", U.S. Appl. No., 10/896,054, filed Jul. 22, 2004.

Office Action Issued by the Korean Patent Office on May 19, 2006, for Korean Patent Application No. 10-2004-111801, and English-language translation thereof.

Office Action issued by the Japanese Patent Office on Oct. 23, 2007, for Japanese Patent Application No. 2003-435756, and English-language Summary thereof.

* cited by examiner

METHOD OF PRODUCING ELECTRONIC CIRCUIT, AND ELECTRONIC CIRCUIT SUBSTRATE

CROSS-REFERENCE TO THE INVENTION

This application is based upon and claims the benefit of priority from the prior Japanese Patent Application No. 2003-435756, filed on Dec. 26, 2003; the entire contents of which are incorporated herein by reference.

BACKGROUND OF THE INVENTION

1. Field of the Invention

The present invention relates to a method of producing an electronic circuit and to an electronic circuit substrate.

2. Description of the Related Art

Conventionally, when producing an electronic circuit substrate, a conductor pattern is formed by performing resist coating on a thin metal film, exposure, development, etching, and the like (refer to Japanese Patent Laid-open Application No. Hei 7-263841). However, this method requires exposure masks for respective layers, the design and production thereof require a plenty of time and costs. Besides, when alternation, modification or the like of an electronic circuit substrate becomes necessary, a great influence is exerted upon the time of delivery or costs of the electronic circuit substrate.

Because of these disadvantages, a method of forming an electronic circuit substrate by printing using electrophotography is proposed instead of the above method. In this method, an underlying layer for electroless plating having an arbitrary pattern is first prepared by using electrophotography with a charged particle containing fine metal particles in the resin. A plating layer is formed on the underlying layer by electroless plating, and an insulating layer is formed by electrophotography using charged particles made of resin only, so that the electronic circuit substrate is formed.

Note that since the above-described insulating layer requires sufficient electric insulation, it is necessary for it to have a thickness of 20 µm or more. Here, the thickness of the insulating layer formed by printing charged particles in one printing depends on the average particle size of the charged particles. Accordingly, it is conceivable to use charged particles having a large average particle size capable of obtaining a thickness of 20 µm or more in one printing to form an insulating film. However, there are a couple of disadvantages to form an insulating layer by using such large charged particles. One is the generation of a void in the insulating layer. Another is that in the case of using a large charged particle, a pattern cannot be formed because the resolution of a pattern largely depends on the particle size.

BRIEF SUMMARY OF THE INVENTION

According to one mode of the present invention, a method of producing an electronic circuit, comprising forming an integrated resin layer having a prescribed thickness by repeating a resin layer forming process a number of times so that resin layers are layered to be integrated with all the resin layers on a substrate, wherein the resin forming process comprises charging the surface of a photoconductor; forming an electrostatic latent image having a prescribed pattern on the surface of the charged photoconductor; forming a visible image by electrostatically attaching charged particles composed of resin on the surface of the photoconductor on which the electrostatic latent image is formed; transferring the visible image formed on the surface of the photoconductor and composed of the charged particles onto the substrate; and fixing said visible image transferred onto said substrate on said substrate to form the resin layer on said substrate, is provided.

According to another mode of the present invention, an electronic circuit substrate, comprising a substrate; a plating layer formed on said substrate; and a resin layer formed on said plating layer using the resin particles having the average particle size from 7 to 18 µm, is provided.

DETAILED DESCRIPTION OF THE INVENTION

Figure 1:
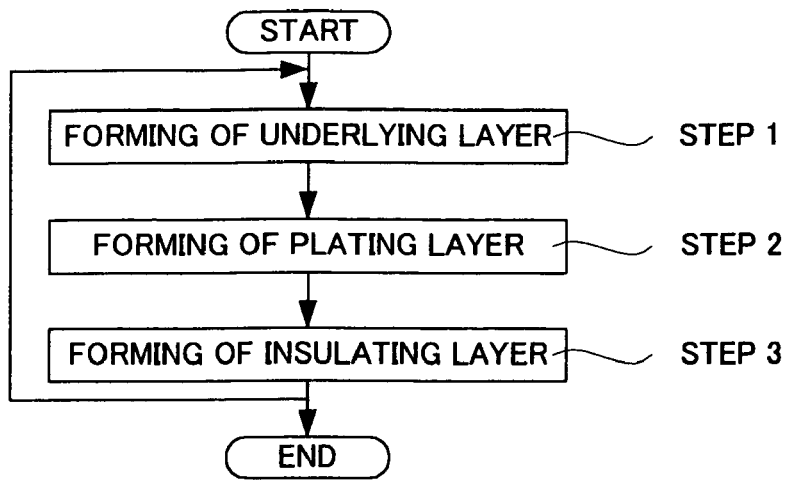
FIG. 1 is a flow chart showing a flow of a production process of an electronic circuit substrate relating to an embodiment of the present invention.
Figure 2:
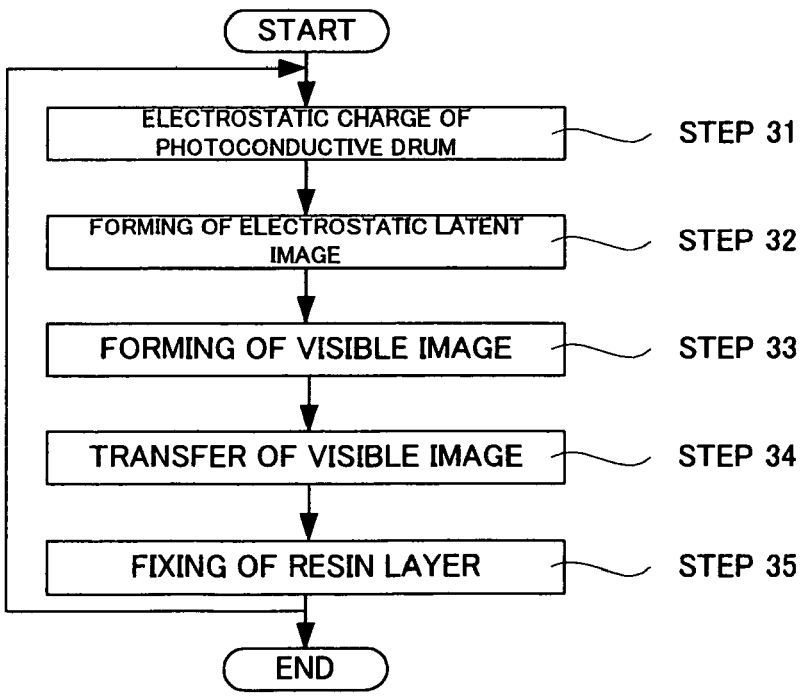
FIG. 2 is a flow chart showing a flow of forming process of a resin layer relating to the embodiment of the present invention.
Figure 4:
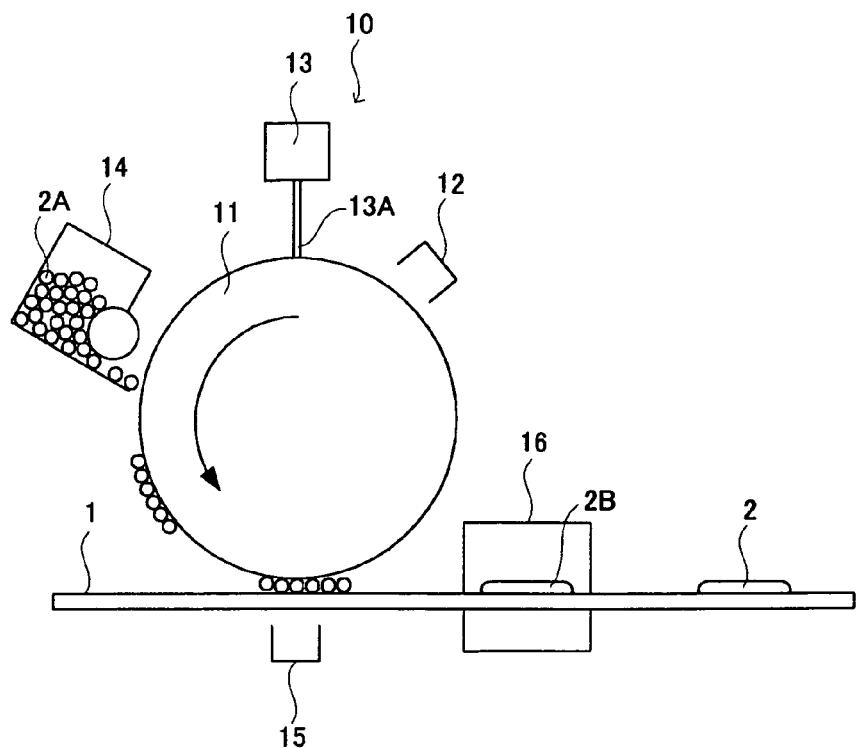
FIG. 4 is a view showing the operation of an underlying layer forming apparatus relating to the embodiment of the present invention.
Figure 5:
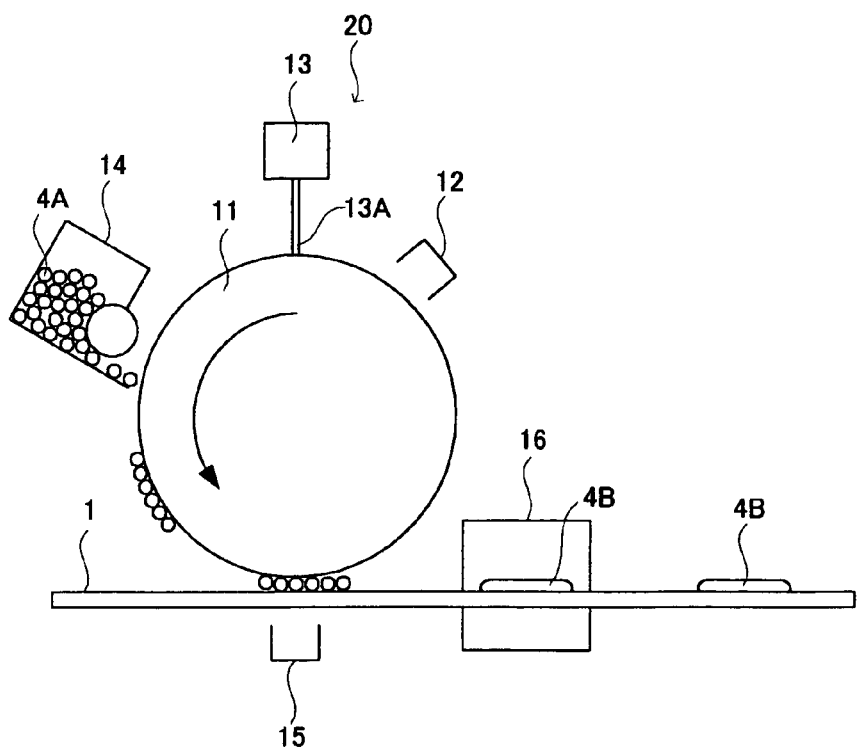
FIG. 5 is a view showing the operation of an insulating layer forming apparatus relating to the embodiment of the present invention.

Hereinafter, an embodiment will be explained. FIG. 1 is a flow chart showing a flow of a production process of an electronic circuit substrate relating to an embodiment of the present invention, and FIG. 2 is a flow chart showing a flow of forming process of a resin layer relating to the present embodiment. FIGS. 3A to 3E are schematic diagrams of a production process of the electronic circuit substrate relating to the present embodiment. FIG. 4 is a view showing the operation of an underlying layer forming apparatus relating to the present embodiment, and FIG. 5 is a view showing the operation of an insulating layer forming apparatus relating to the present embodiment.

Figure 3A:
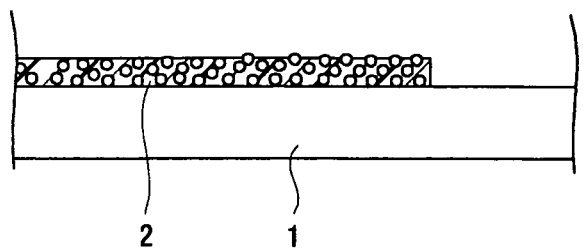
FIGS. 3A to 3E are schematic diagrams of a production process of the electronic circuit substrate relating to the embodiment of the present invention.

First, as shown in FIG. 1 and FIG. 3A, an underlying layer 2 for electroless plating is formed by printing using electrophotography on a substrate 1 (step 1). The underlying layer 2 can be formed by using an underlying layer forming apparatus 10 as shown in FIG. 4. Concretely, the underlying layer forming apparatus 10 mainly comprises a photoconductive drum 11, an electrostatic charger 12, a laser generator and scanner 13, a developing machine 14, a transfer printing machine 15, and a fixing apparatus 16.

In order to form the underlying layer 2, while the photoconductive drum 11 is turned along the arrow direction first, a surface potential of the photoconductive drum 11 is uniformly charged at a fixed potential (for instance, a minus charge) by the electrostatic charger 12. As a concrete method of charging, a Scorotron method, a roller method, and a brush method can be cited.

Next, a laser beam 13A is irradiated to the photoconductive drum 11 in response to an image signal by a laser generator and scanner 13 removing the minus charge in the irradiated portion to form a charged image (electrostatic latent image) of a prescribed pattern on the surface of the photoconductive drum 11.

Then, charged resin particles containing fine metal particles 2A stored in the developing machine 14 are electrostatically attached on the electrostatic latent image on the photoconductive drum 11 by means of a feeder to obtain a visible image. A dry or wet toner transfer technology in a well known electrophotography type copy system can be applied to the developing machine 14.

When the developing machine 14 is a dry type, the metal-containing resin particles 2A having a particle size from 3 to 50 μm are stored in the developing machine 14. A more desirable particle size of the metal-containing resin particles 2A is from 5 to 10 μm. When the developing machine 14 is a wet type, the metal-containing resin particles 2A having a particle size of 3 μm or less are stored in the developing machine 14 together with a liquid which serves as a solvent.

The metal-containing resin particles 2A stored in the developing machine 14 are supplied to the photoconductive drum 11 by means of the feeder to be developed. At this time, a charged-area development or a discharged-area development can be used.

A B-stage thermosetting resin which is solid at room temperatures is used as a resin composing a metal-containing resin particle here. The B-stage refers to a state in which at least one portion of the thermosetting resin is not hardened but melted when prescribed heat is applied. As the b-stage thermosetting resin, epoxy resin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and so on can be used, and a charge control agent can be added thereto as necessary.

The metal-containing resin particle 2A is mainly composed of a B-stage thermosetting resin, in which conductive fine metal particles having, for instance, a particle size ranged from 0.05 to 3 μm are contained at a rate from 15 to 70 wt %. A more desirable content of the fine metal particles contained in the metal-containing resin particle 2A is from 30 to 60 wt %. Here, as the fine metal particles, at least one kind of fine metal particles selected from the group consisting of platinum (Pt), palladium (Pd), copper (Cu), gold (Au), nickel (Ni), and silver (Ag) is desirably used. These fine metal particles serve as kernels for electroless plating to be described later and have a catalytic function for progress of a plating reaction. Among these metal elements, especially palladium or copper is desirably used.

Then, the visible image (pattern) formed with the metal-containing resin particles 2A on the surface of the photoconductive drum 11 is electrostatically transferred onto a desired substrate 1 from the photoconductive drum 11 by the transfer printing machine 15. The photoconductive drum 11 is recovered after the transfer by removing the metal-containing resin particles 2A left on the surface of the photoconductive drum 11 with a cleaning apparatus (not shown).

Then, the B-stage metal-containing resin particles 2A, which are transferred onto the substrate 1, are passed through the fixing apparatus 16 which emits heat or light, so that a thermosetting resin composing the metal-containing resin particles 2A is melted to form a metal-containing resin layer 2B. Thereafter, the metal-containing resin layer 2B is heated or irradiated with light by the fixing apparatus 16 to be hardened so that the metal-containing resin layer 2B is fixed on the substrate 1. Through these processes, an underlying layer 2 is formed.

Figure 3B:
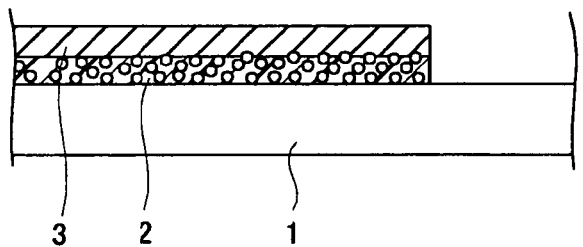

After forming the underlying layer 2 on the substrate 1, a plating layer 3 is formed on the underlying layer 2 by electroless plating using the fine metal particles contained in the underlying layer 2 as kernels (step 2) as shown in FIG. 3B. It should be noted that though the plating layer 3 is formed by electroless plating in the present embodiment, the plating layer 3 can be formed by both of electroless plating and electroplating.

In order to effectively perform the electroless plating, it is recommendable to treat at least some of the fine metal particles to project on the surface of the underlying layer 2 before performing the electroless plating to the underlying layer 2. As such a treatment, for instance, etching with a solvent such as aceton, isopropanol acid or alkali or the like, or shot blasting, airblasting and so on can be cited.

After forming the plating layer 3 on the substrate 1, an electrically insulative insulating layer 4 is formed on the substrate 1 by printing using the electrophotography (step 3). The insulating layer 3 can be formed using an insulating layer forming apparatus 20 nearly similar in structure to the underlying layer forming apparatus 10. A resin particle 4A is stored in the developing machine 14 in place of the metal-containing resin particle 2A.

In order to form the insulating layer 4, first, as shown in FIG. 2, while the photoconductive drum 11 is turned along the arrow direction, a surface potential of the photoconductive drum 11 is uniformly charged at a fixed potential (for instance, minus charge) by the electrostatic charger 12 (step 31).

Next, after charging the surface of the photoconductive drum 11, a laser beam 13A is irradiated to the photoconductive drum 11 in response to an image signal by the laser generator and scanner 13 removing the minus charge in the irradiated portion to form a charged image (electrostatic latent image) of a prescribed pattern on the surface of the photoconductive drum 11 (step 32).

After the electrostatic latent image is formed on the surface of the photoconductive drum 11, the resin particles 4A, which are charged by the developing machine 14, are electrostatically attached on the surface of the photoconductive drum 11 to form a visible image on the surface of the photoconductive drum 11 (step 33). A dry or wet toner transfer technology in a well-known electrophotography copying system can be applied to the developing machine 14.

The resin particles 4A having an average particle size from 7 to 18 μm, or more desirably from 8 to 15 μm, are stored in the developing machine 14. When forming the insulating layer 4, the insulating layer should have enough thickness to provide electric insulation, and therefore, the particle size of the resin particle 4A should be larger than that of the metal-containing resin particle 2A.

The resin particles 4A stored in the developing machine 14 are supplied to the photoconductive drum 11 by a feeder to be developed. At this time, a charged area development or a discharged area development can be used.

A thermosetting resin in a B-stage solid at room temperatures can be used as a resin composing the resin 4A. As B-stage thermosetting resin, epoxy resin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and so on can be used, and an electrostatic charge control agent can be added thereto as necessary. It is also recommendable to disperse fine particles of silica or the like contained in the resin particles 4A at a prescribed ratio, thereby enabling to control the characteristics such as stiffness, coefficient of thermal expansion and the like especially in a multilayer wiring substrate, so that improvement in reliability of substrate can be realized.

After the visible image (pattern) is formed on the surface of the photoconductive drum 11, it is electrostatically transferred onto the desired substrate 1 from the photoconductive drum 11 by the transfer printing machine 15 (step 34). The photoconductive drum 11 after the transfer is recovered by removing the resin particles 4A left on the surface of the photoconductive drum 11 with a cleaning apparatus (not shown).

Figure 3C:
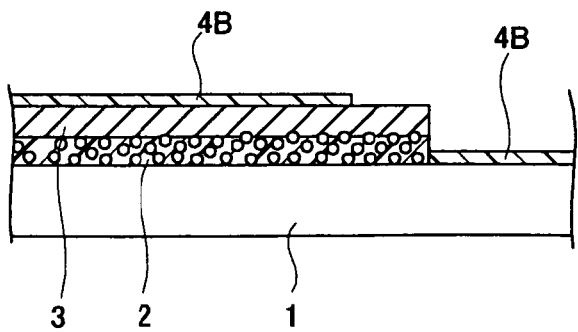

After the visible image is transferred onto the substrate 1, the visible image is heated by means of the fixing apparatus 16 to soften the resin particles 4A composing the visible image so that a resin layer 4B is formed. Then, the resin layer 4B is hardened by heat or light irradiation with the fixing apparatus 16 to fix the resin layer 4B on the substrate 1 (step 35). Through the above process, the resin layer 4B is formed on the substrate 1 as shown in FIG. 3C. Here, the resin layer 4B is formed in a manner such that the thickness of the resin layer 4B is at most twice the average particle size of the resin particles 4A.

Figure 3D:
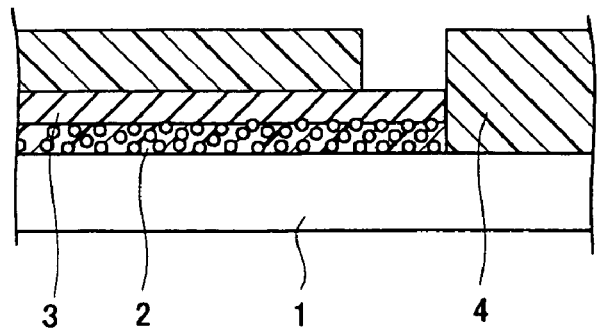

After forming the resin layer 4B on the substrate 1, the forming process of the resin layer in steps 31 to 35 is repeated so that resin layers 4B having the same pattern as that of the resin layer 4B are continually piled on the resin layer 4B one by one. When a resin layer 4B is fixed on the resin layer 4B here, the former is integrated with the latter. The forming process of the resin layer is repeated until the thickness of the integrated resin layer 4B reaches a prescribed thickness, for instance, from 15 to 50 µm, thereby forming an insulating layer 4 composed of the integrated resin layer 4B as shown in FIG. 3D.

Figure 3E:
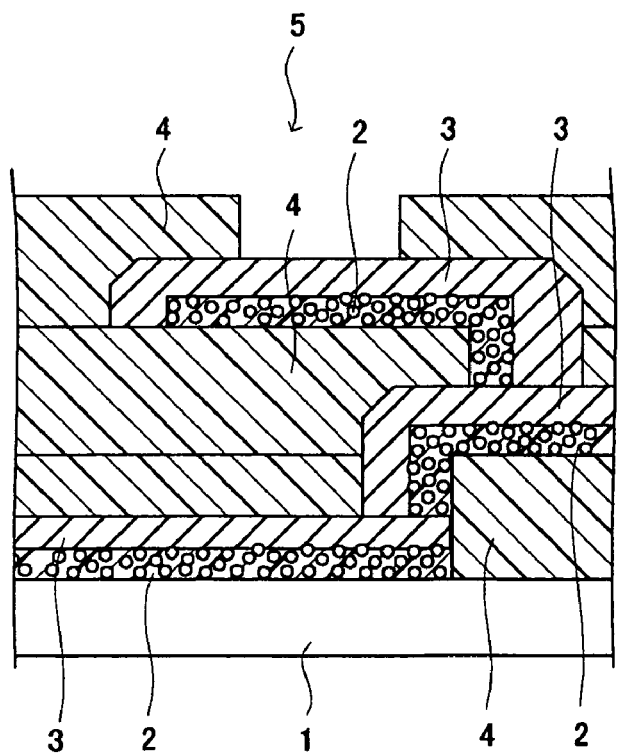

After forming the insulating layer 4 on the substrate, the forming process of the electronic circuit in steps 1 to 3 is repeated to form a multilayered substrate for the electronic circuit 5 shown in FIG. 3E.

In the present embodiment, since the forming process of the resin layer is repeated a number of times in a manner such that the resin layers 4B are layered to form the insulating layer 4 which has a prescribed thickness and is composed of the integrated resin layer 4B, on the substrate 1, it is possible to obtain the insulating layer 4 having a sufficient thickness and resolution, and few voids. It is thought that the reason for the generation of voids is that when the resin particles 4A are softened, air existing between the resin particles 4A remains in the insulating layer 4 without being discharged from the insulating layer 4. On the other hand, when the insulating layer 4 is formed by printing using electrophotography, since the thickness of a resin layer capable of being formed in one printing depends on the average particle size of the resin particles 4A as described above, if an insulating layer 4 of 20 µm in thickness is formed in two or more printings for instance, it is necessary to use resin particles 4 having the average particle size smaller than that of the resin particles used to form the insulating layer 4 in one printing. Considering the cases where the insulating layers are formed using resin particles having a small average particle size and a large average particle size respectively, air existing between the resin particles is less in the case of using resin particles having a smaller average particle size than in the case of using resin particles having a larger average particle size. Besides, since the softening is carried out at every printing, the void is discharged each time. Therefore, it is possible to obtain an insulating layer having fewer voids by forming the insulating layer in two or more printings than by forming the insulating layer in one printing. Besides, since the forming process of the resin layer is repeated until the thickness of the insulating layer reaches a prescribed thickness, an insulating layer 4 having sufficient thickness can be obtained.

In the present embodiment, since the resin layer 4B, the thickness of which is at most twice the average particle size of the resin particles 4A, can be formed in one forming process of the resin layer, it is possible to obtain an insulating layer 4 with high resolution.

EXAMPLE

An example will be explained below. In this example, resin layers having prescribed patterns are respectively prepared by electrophotography using resin particles different in average particle size, and resolution and void for the respective cases are studied.

In the present example, resin particles having average particle sizes of 7.9 µm, 11.7 µm, 21.2 µm, and 29.8 µm are prepared, resin layers having prescribed patterns are respectively formed by electrophotography using these resin particles, and resolution and void for the respective cases are studied.

Figure 6:
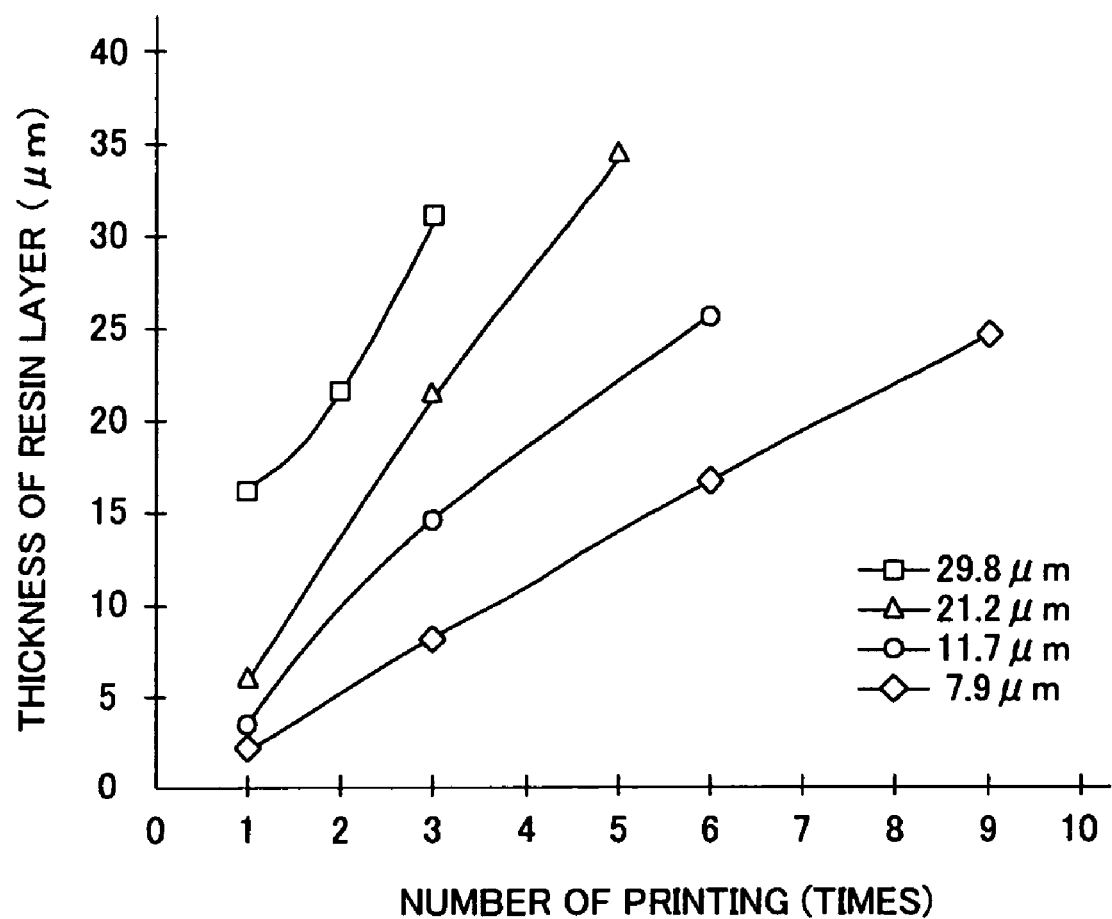
FIG. 6 is a graph showing relations between number of printings and thickness of the resin layer.

The result of the above-described study will be described next. FIG. 6 is a graph showing relations between the number of printings and the thickness of the resin layer. As shown in FIG. 6, the larger the average particle size of the resin particles used, the greater the thickness of the resin layer formed in one printing becomes. Accordingly, when the resin particles have an average particle size as large as possible, the prescribed thickness can be reached in fewer printings. However, when resin layers are formed using resin particles having average particle sizes of 21.2 µm, and 29.8 µm, the resin particles are scattered outside of the prescribed pattern. When resin layers are formed using resin particles having average particle sizes of 7.9 µm, 11.7 µm, and 21.2 µm, the number of voids inside the resin layer is small, but when a resin layer is formed using resin particles having an average particle size of 29.8 µm, numerous voids can be observed inside the resin layer. From these results, it is confirmed that by using resin particles having a smaller average particle size, better resolution can be obtained with fewer voids.

It should be noted that the present invention is not limited to the content of the description in the above-described embodiment, structures, materials, arrangements of respective members, and the like can be appropriately modified within the meaning and range of equivalency of the present invention.

What is claimed is:

1. A method of producing an electronic circuit, comprising:
   forming an integrated resin layer made of B-stage solid resin at room temperature, containing no metal particle and having a prescribed thickness by repeating a resin layer forming process a number of times so that resin layers made of B-stage solid resin at room temperature and containing no metal particle are layered to be integrated with all the resin layers on a substrate,
   wherein said resin layer forming process comprises:
   charging the surface of a photoconductor with no pattern;
   forming an electrostatic latent image having a prescribed pattern on the surface of the charged photoconductor by means of laser irradiation;
   forming a visible image by electrostatically attaching charged particles composed of B-stage solid resin at room temperature and containing no metal particle on the surface of said photoconductor on which said electrostatic latent image is formed;
   transferring the visible image formed on the surface of the photoconductor and composed of the charged particles onto the substrate; and
   hardening said visible image transferred onto said substrate on said substrate to form the resin layer made of B-stage solid resin at room temperature and containing no metal particle on said substrate.

2. A method of producing the electronic circuit according to claim 1,
wherein said resin layer forming process comprises forming of the resin layer in such that the thickness of the resin layer at one time of said resin layer forming process corresponds to twice or less the average particle size of said charged particles.

3. A method of producing the electronic circuit according to claim 1,
wherein the average particle size of said charged particles is from 7 to 18 μm.

4. A method of producing the electronic circuit according to claim 1,
wherein the average particle size of said charged particles is from 8 to 15 μm.

5. A method of producing the electronic circuit according to claim 1,
wherein said prescribed thickness is from 15 to 50 μm.

6. A method of producing the electronic circuit according to claim 1, further comprising before the resin layer forming process:
forming a metal-containing resin layer on said substrate using metal-containing resin particles composed of a resin and fine metal particles contained in said resin; and
forming a plating layer on said metal-containing resin layer utilizing said fine metal particles as kernels,
wherein said resin layer is formed on the plating layer.

7. A method of producing the electronic circuit according to claim 6,
wherein a forming process of said metal-containing resin layer, comprising:
forming a visible image on the surface of a photoconductor on which an electrostatic latent image is formed by electrostatically attaching said metal-containing resin particles; and
transferring the visible image formed on the surface of said photoconductor and composed of said metal-containing resin particles onto said substrate.

8. A method of producing the electronic circuit according to claim 6,
wherein a resin in said metal-containing resin particle comprises a B-stage thermosetting resin.

9. A method of producing the electronic circuit according to claim 6,
wherein said fine metal particle is at least one kind of the fine metal particles selected from the group consisting of platinum (Pt), palladium (Pd), copper (Cu), gold (Au), nickel (Ni), and silver (Ag).

* * * * *